United States Patent [19]
Walker

[11] Patent Number: 5,788,510
[45] Date of Patent: Aug. 4, 1998

[54] SOCKET HAVING A STAGGERED CONDUCTIVE PATH THROUGH MULTIPLE MEMORY MODULES

[75] Inventor: Kevin Eugene Walker, Hershey, Pa.

[73] Assignee: The Whitaker Corporation, Wilmington, Del.

[21] Appl. No.: 870,071

[22] Filed: Jun. 2, 1997

[51] Int. Cl.[6] .................................................. H01R 9/09
[52] U.S. Cl. ............................................. 439/61; 361/785
[58] Field of Search .............................. 439/61, 62, 74, 439/631, 377; 361/785

[56] References Cited

U.S. PATENT DOCUMENTS

| 5,104,324 | 4/1992 | Grabbe et al. | 439/62 |
| 5,214,572 | 5/1993 | Cosimano et al. | 439/61 |
| 5,306,159 | 4/1994 | Noll et al. | 439/61 |
| 5,419,712 | 5/1995 | Bellomo et al. | 439/61 |
| 5,530,623 | 6/1996 | Sanwo et al. | 439/61 |

*Primary Examiner*—Neil Abrams
*Assistant Examiner*—Barry M. L. Standig

[57] ABSTRACT

A socket connector for high speed memory modules utilizes planar contact strips having the same contact element design for signal, ground, power and daisy chain. The daisy chain contact strips are segmented and staggered to permit the use of flat contact elements.

20 Claims, 8 Drawing Sheets

SOCKET HAVING A STAGGERED CONDUCTIVE PATH THROUGH MULTIPLE MEMORY MODULES

BACKGROUND OF THE INVENTION

This invention relates to a socket connector for supporting and electrically interconnecting a plurality of electronic modules to a substrate and, more particularly, to such a socket connector wherein a daisy chain conductive path through all of the modules held by the socket connector is achieved with a flat blank contact.

Computers are often provided with plug-in high speed memory modules. When providing a socket connector for such a device, one requirement is to minimize the electrical lengths of all interconnections between the device and the substrate (i.e., the mother board) to which they are connected. The device is a silicon chip mounted to a module board and has four different types of contact pads on the board. Thus, there are high speed signal contact pads, ground contact pads, power contact pads and contact pads for providing a daisy chain conductive path through all of the interconnected modules in the socket connector. It is therefore a primary object of the present invention to provide a socket connector for such modules which uses simple contact geometry and is readily assembled.

SUMMARY OF THE INVENTION

According to the present invention, there is provided a socket connector for supporting and electrically interconnecting a plurality of electronic modules to a substrate. Each of the modules includes a substantially planar and rectangular mounting board having an array of contact pads on a first major surface along a leading edge of the board. On each of the boards a correspondingly positioned pair of contact pads are utilized to daisy chain a conductive path through all of the modules supported and electrically interconnected by the socket connector. The connector comprises a housing and a plurality of planar contact strips. The housing has a base wall and four side walls together forming a substantially rectilinear cavity with an open side. The base wall is formed with a plurality of parallel channels open to the cavity. Each of the base wall channels receives the leading edge of a respective one of the boards. An opposed pair of the side walls are each formed with a plurality of parallel slots open to the cavity and extending from the open side of the cavity toward the base wall. Each of the side wall slots is aligned with a respective one of the base wall channels for supporting and guiding a respective one of the boards toward the respective base wall channel. Each of the planar contact strips includes an elongated carrier strip and a plurality of contact elements extending laterally from one edge of the carrier strip. The number of contact elements associated with each carrier strip is equal to the number of base wall channels. Each of the contact elements is adapted to be received in a respective one of the base wall channels for engaging a respective contact pad of a board received in the respective base wall channel. Each of the contact elements includes a pair of spring arms extending from a connecting stub attached to the associated carrier strip one edge so as to be substantially U-shaped. The pair of spring arms extend toward each other at their distal ends so as to each engage a respective major surface of a board received in the respective base wall channel, with one of the pair of spring arms engaging a respective contact pad on that board. The pair of contact strips associated with the correspondingly positioned pair of contact pads on all of the boards are arranged with each carrier strip separated between alternate adjacent contact elements and with the pair of contact strips so arranged that the separations of the respective carrier strips are between different adjacent pairs of contact elements. Accordingly, the daisy chain conductive path is staggered and alternates along the associated pair of contact strips. In accordance with an aspect of this invention, the base wall is formed with a plurality of through-slots each associated with one of the contact elements so that the contact elements can be installed in the housing from the exterior side of the base wall with the carrier strips remaining outside the housing.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
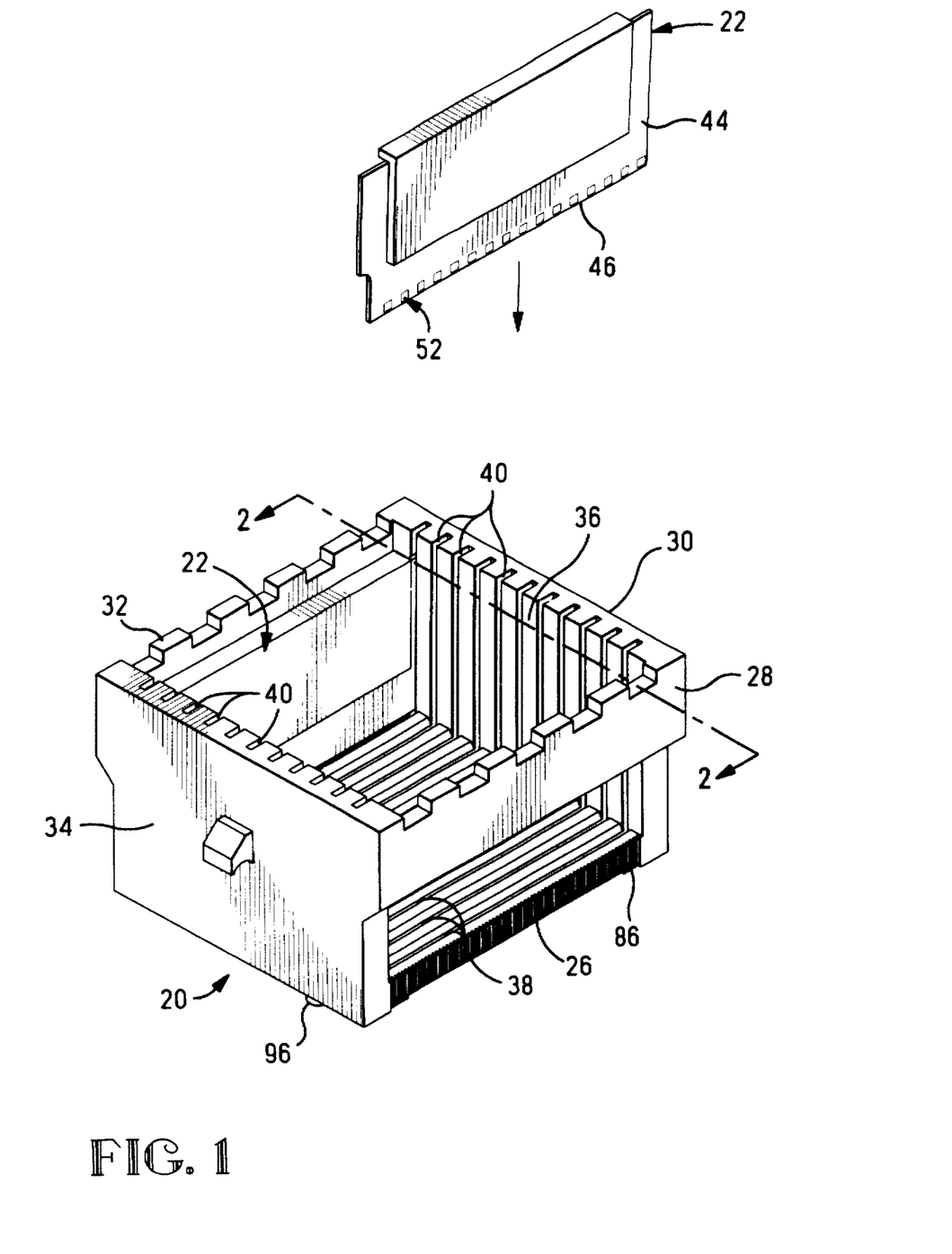
FIG. 1 an isometric view of a socket connector constructed according to the present invention, and showing a first module installed therein and a second module separate therefrom.
Figure 11:
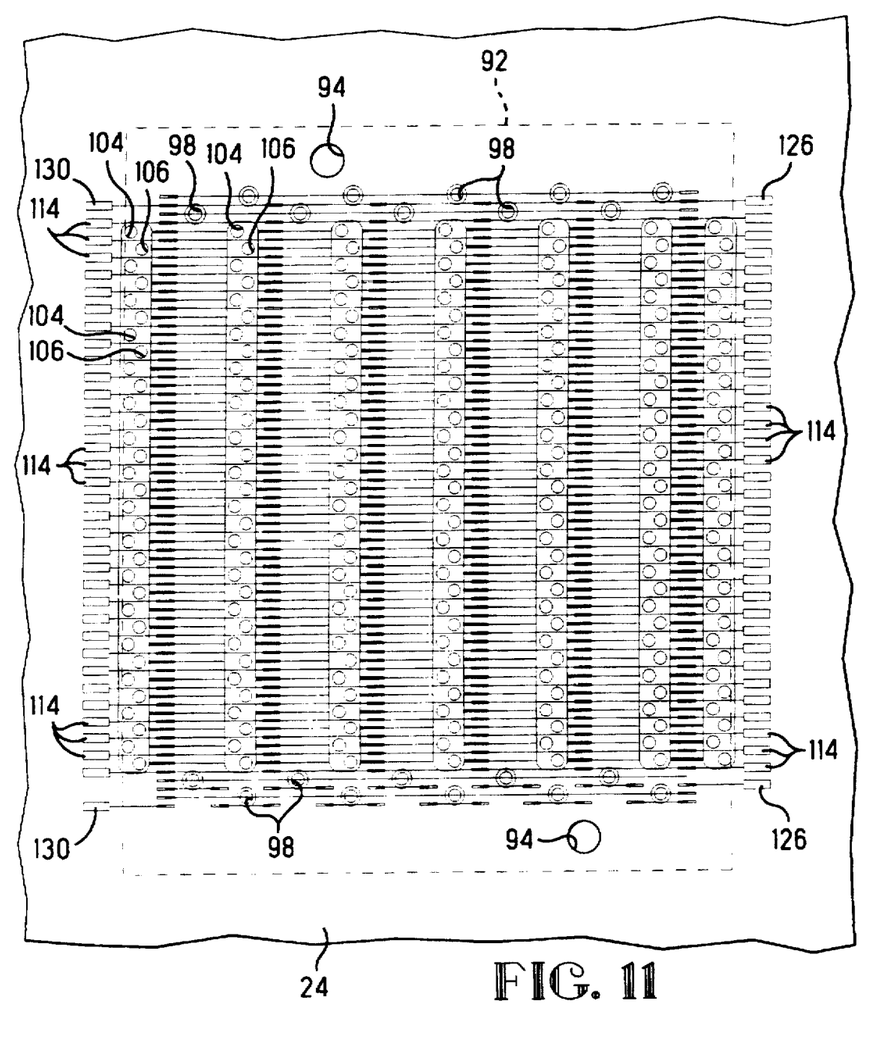
FIG. 11 is a plan view illustrating the layout of the substrate to which the inventive socket connector is mounted.

Referring now to the drawings, FIG. 1 illustrates a socket connector, designated generally by the reference numeral 20, constructed according to the present invention, along with two illustrative electronic modules 22 which are supported and electrically interconnected by the socket connector 20. The socket connector 20 is mounted to a substrate, or mother board, 24 (FIG. 11). The socket connector 20 includes a housing having a base wall 26 and four side walls 28, 30, 32, 34 which together form a substantially rectilinear cavity 36 having an open side.

For purposes of illustration, the socket connector 20 is shown as accommodating eleven of the modules 22. It is understood that a similar socket connector can be constructed to accommodate fewer or more of the modules. The base wall 26 is formed with a plurality of parallel channels 38 open to the cavity 36, each of the channels 38 corresponding to a respective one of the modules 22 to be accommodated by the second connector 20. Thus, in the illustration, there are eleven such channels 38. The side walls 30, 34, which are opposed across the cavity 36, are each formed with a plurality of parallel slots 40 which are open to the cavity 36 and extend from the open side of the cavity 36 toward the base wall 26. Each of the slots 40 is aligned with a respective one of the base wall channels 38.

Figures 1A, 3:
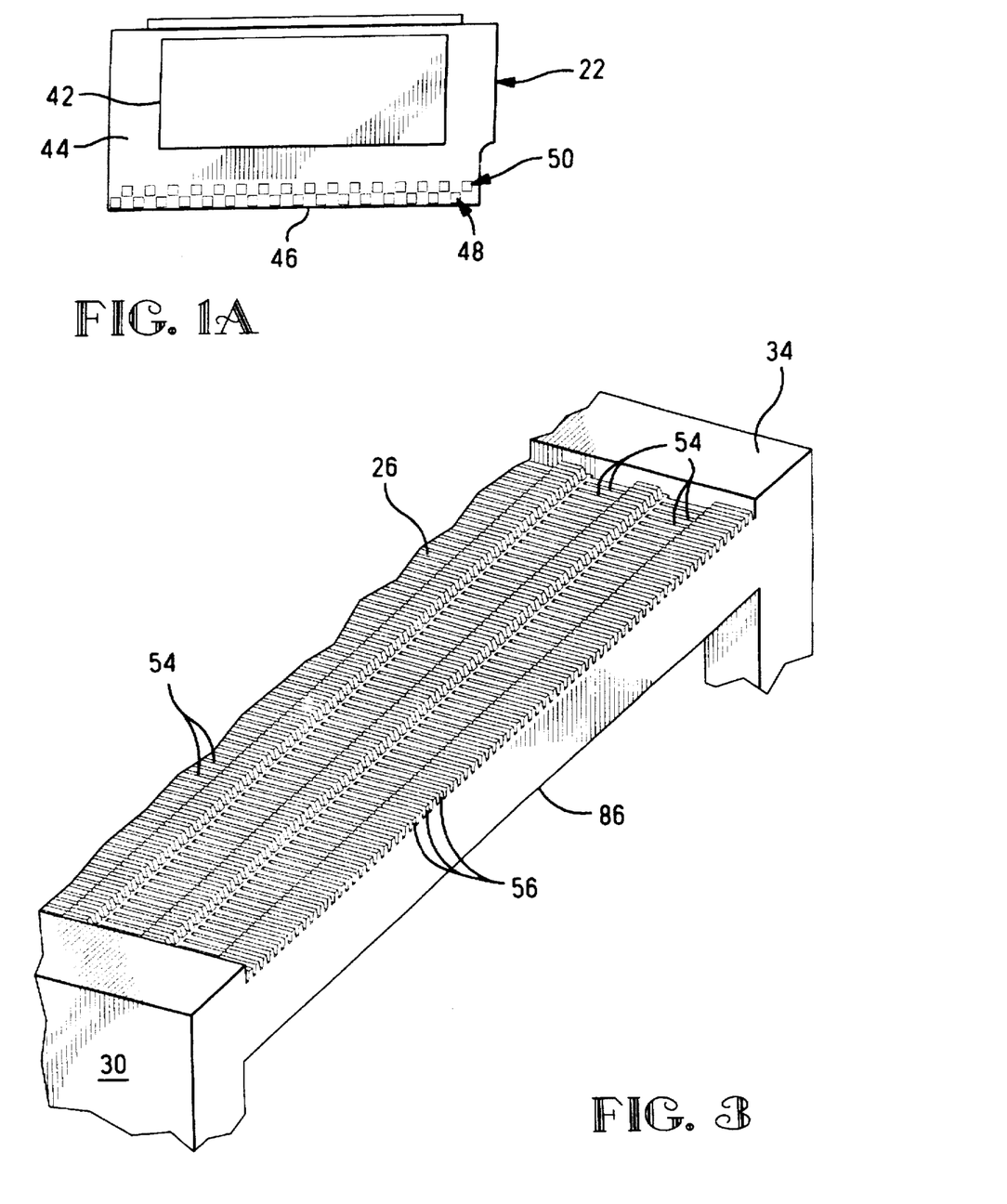
FIG. 1A is a plan view showing the reverse side of the second module shown in FIG. 1.
FIG. 3 as a partial isometric view of the underside of the socket connector housing.
Figure 2:
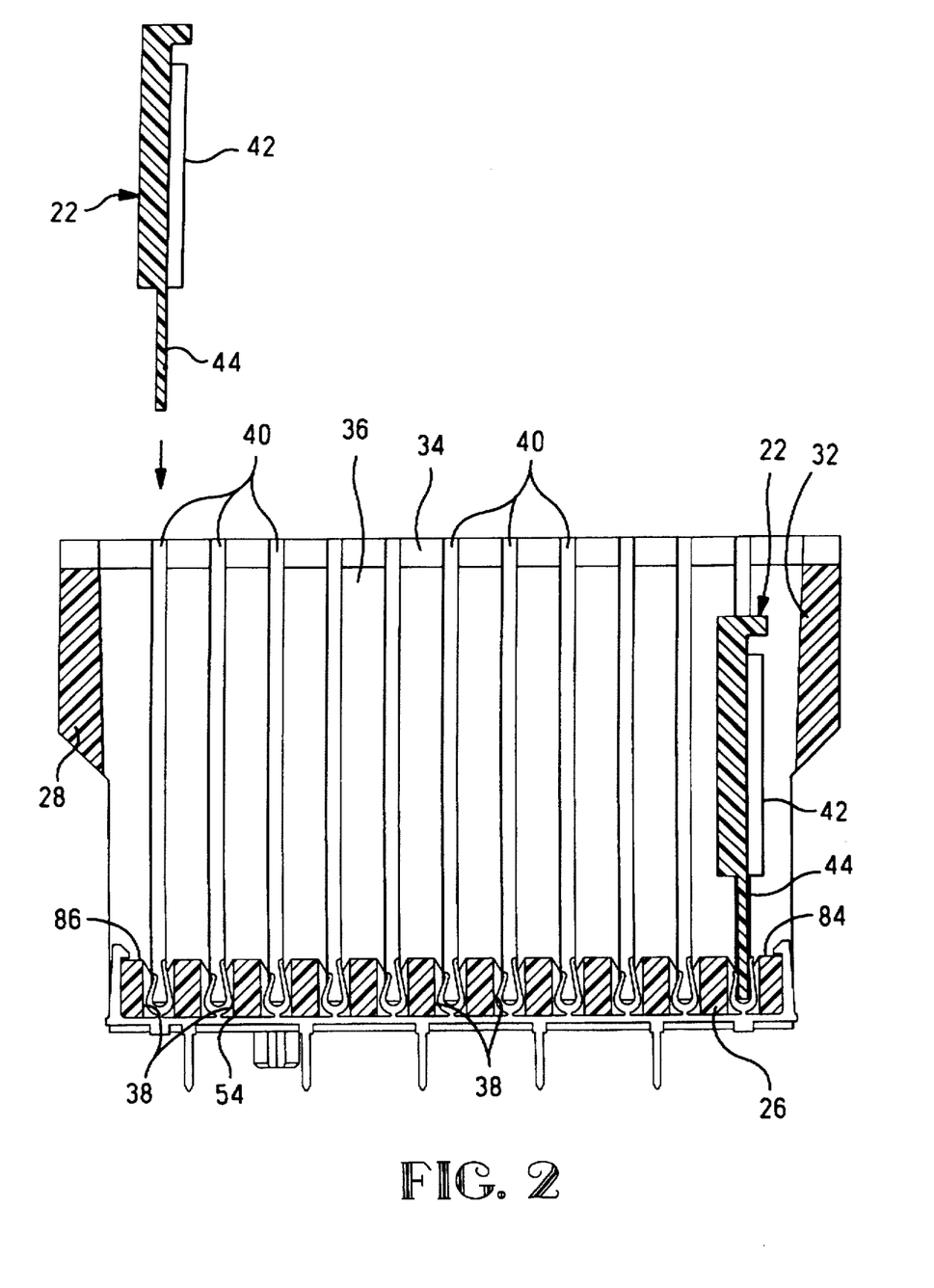
FIG. 2 is a cross sectional view taken along the line 2—2 in FIG. 1.

As shown, each of the modules 22 includes electronic circuitry 42 mounted on a substantially planar and rectangular mounting board 44. The circuitry 42 is illustratively a silicon memory chip, but may be any other circuitry. As shown in FIG. 1A, along the leading edge 46 and on a first major surface of the board 44 is a first linear array 48 of contact pads spaced a first distance from the leading edge 46 and a second linear array 50 of contact pads spaced a second distance from the leading edge 46. The pads of the first and second linear arrays 48, 50 alternate with each other along the length of the leading edge 46. As shown in FIG. 1, on the second major surface of the board 44 is a third linear array 52 of contact pads spaced the first distance from the leading edge 46 and laterally aligned with the pads of the second linear array 50. Thus, some of the contact pad positions on the board 44 have contact pads on both major surfaces of the board 44 and the remainder of the contact pad positions have contact pads only on the first major surface of the board 44.

Thus, opposed pairs of the slots 40 are utilized for supporting and guiding a respective board 44 toward the respective base wall channel 38, which receives the leading edge 46 of the board therein. As will be described in full detail hereinafter, contacts disposed in the channels 38 engage respective ones of the contact pads 48, 50, 52 for interconnecting the modules 22 and connecting them to circuitry on the mother board 24.

In the illustrative embodiment, correspondingly positioned signal, ground and power contact pads on the boards 44 are all interconnected. A correspondingly positioned pair of contact pads on each of the boards 44 are utilized to daisy chain a conductive path through all of the modules supported and electrically interconnected by the socket connector 20. As will be described, the inventive construction utilizes contact elements disposed in the base wall channels 38 which are of identical flat blank construction and which differ only in the details of the carrier strips to which they are connected.

As will be described, the contact elements are installed within the base wall channels 38 from the underside of the base wall 26, with the carrier strips to which the contact elements are attached remaining between the exterior side of the base wall 26 and the mother board 24, so that they can be connected to circuit traces on the mother board 24. Thus, as shown in FIG. 3, the base wall 26 is formed with a plurality of through-slots 54. The through-slots 54 are parallel to each other and are arranged in linear arrays each aligned with a respective one of the channels 38. Within each array, there are as many through-slots 54 as there are contact pad positions on the board 44. The exterior side of the base wall 26 is further formed with arrays of separator ribs 56. The arrays of separator ribs 56 are between and flanking the arrays of through-slots 54 and serve to provide separation and support between adjacent contact element carrier strips.

Figure 4:
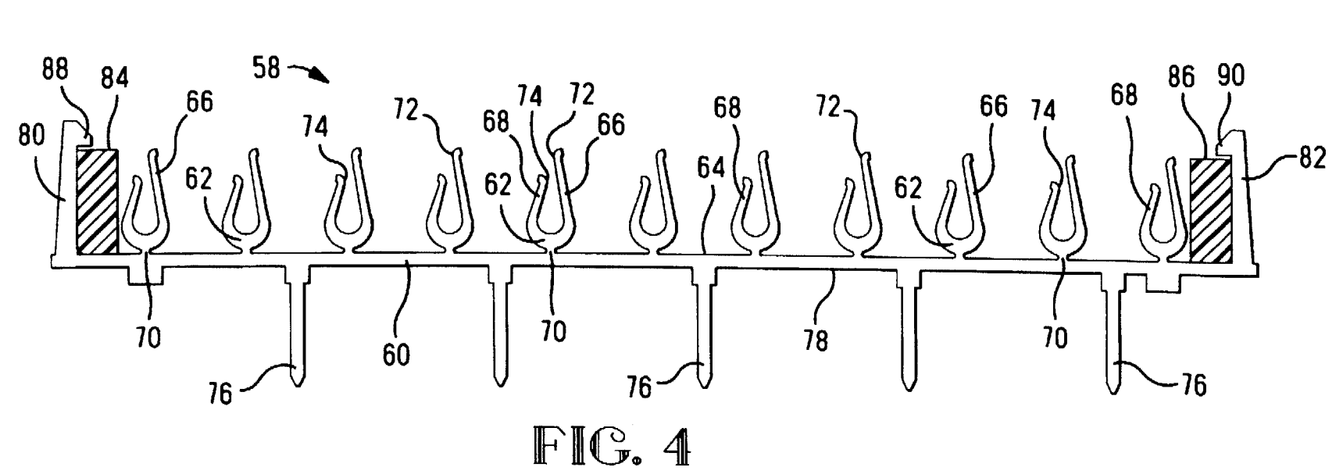
FIG. 4 illustrates a first version of a power contact strip.

FIG. 4 illustrates a contact strip for providing power to a module 22 installed within the socket connector 20. As shown, the contact strip 58 includes an elongated carrier strip 60 and a plurality of contact elements 62 extending laterally from an edge 64 of the carrier strip 60. The number of contact elements 62 attached to the carrier strip 60 is equal to the number of base wall channels 38 and each of the contact elements 62 is adapted to be received in a respective one of the channels 38 through a respective one of the slots 54 so as to engage a respective contact pad of a board 44 received in that channel 38. Each of the contact elements 62 includes a pair of spring arms 66, 68 extending from a connecting stub 70 which is attached to the carrier strip edge 64. The spring arms 66, 68 are together substantially U-shaped and extend toward each other at their distal ends to provide respective curved contact surfaces 72, 74 for engaging respective major surfaces of a board 44. The spring arms 66, 68 are of different lengths. These lengths are chosen so that the contact surface 72 engages a major surface of a board 44 the second distance from the leading edge 46 to engage the contact pads in the array 50, and the contact surface 74 engages a major surface of a board 44 the first distance from the leading edge 46 to engage contact pads either in the array 48 or the array 52. The power contact strip is adapted for through-hole mounting to the mother board 24, so it is formed with a plurality of solder tails 76 attached to the opposite edge 78 of the carrier strip 60. At the opposite ends of the carrier strip 60, a pair of latch fingers 80, 82 extend laterally from the edge 64. The base wall 26 is formed with a pair of ledges 84, 86 which are parallel to and flank the channels 38 and extend between the side walls 30, 34. The distal ends of the latch fingers 80, 82 are formed with respective hook members 88, 90 which each overlie a respective one of the ledges 84, 86 when the contact strip 58 is installed in the housing with the contact elements 62 being inserted into the through-slots 54. These hook members 88,90 interfere with the subsequent removal of the contact strip from the housing.

Figure 5:
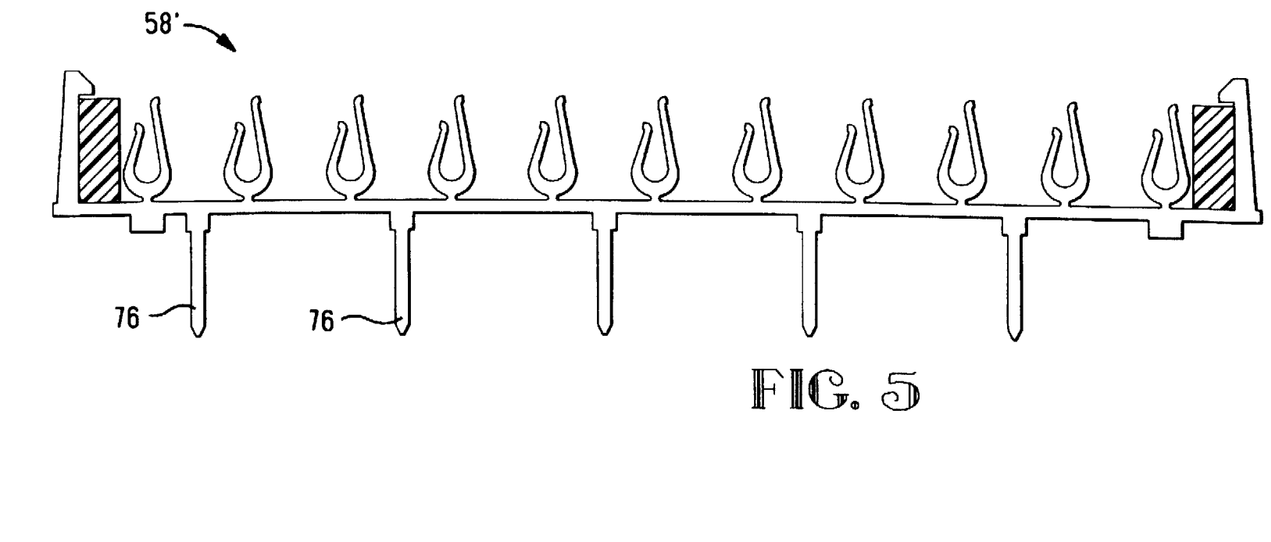
FIG. 5 illustrates a second version of a power contact strip.

FIG. 11 illustrates the layout on the mother board 24 for accepting the socket connector 20. The broken line 92 represents the overall footprint of the socket connector 20, with the holes 94 accepting a pair of alignment pins 96 extending from the exterior side of the base wall 26. The holes 98 are for the solder tails 76 of the power contact strips. Because the holes 98 cannot be too close together, they are staggered for the two power contact strips at either end of the socket connector 20. Thus, the alternate version 58' of the power contact strip shown in FIG. 5 is identical to the power contact strip 58 of FIG. 4 except for the positions of the solder tails 76.

Figure 6:
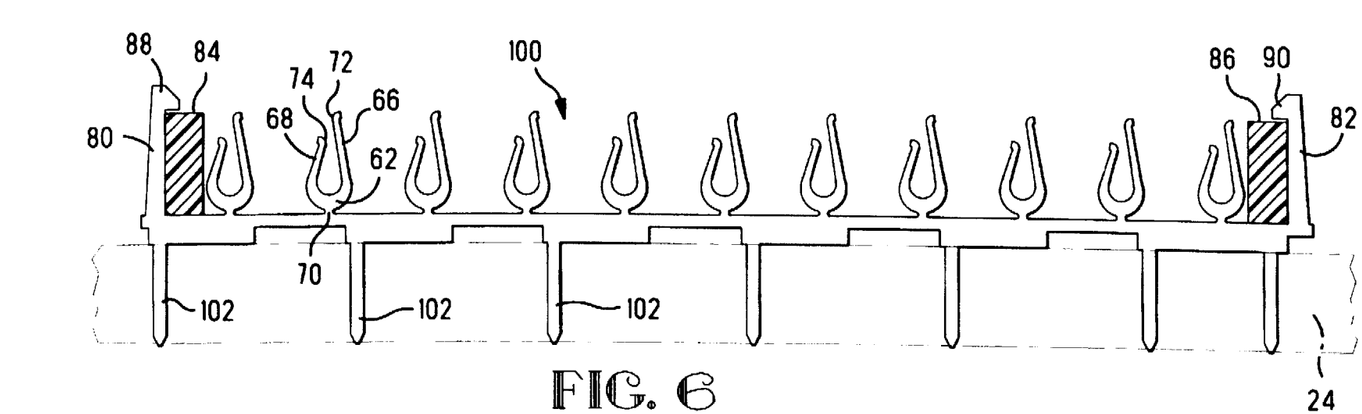
FIG. 6 illustrates a first version of a ground contact strip.
Figure 7:
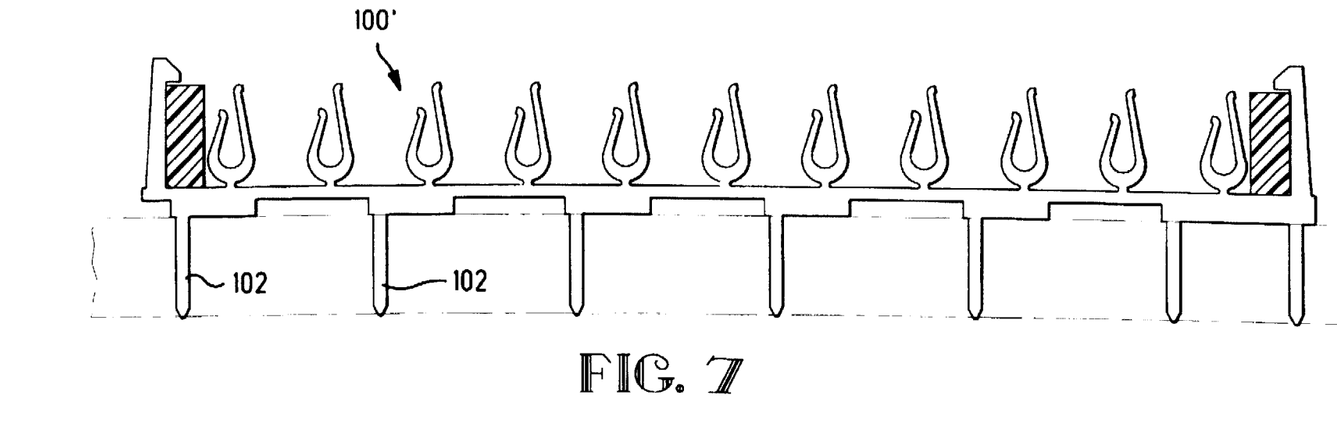
FIG. 7 illustrates a second version of a ground contact strip.

To provide shielding between adjacent signal contact strips, the signal contact strips and ground contact strips alternate. FIG. 6 shows a first version 100 of a ground contact strip. This contact strip 100 is substantially the same as the power contact strip 58 (FIG. 4) with the exception of the size and positioning of the solder tails 102. The solder tails 102 are positioned for insertion in the through-holes 104 in the mother board 24 for through-hole mounting of the ground contact strips. The second version 100' of the ground contact strip (FIG. 7) is identical to the first version 100 except for the positioning of the solder tails 102. The solder tails 102 are positioned to be inserted in the through-holes 106 in the mother board 24, which are offset from the through-holes 104 to preserve minimum spacing between the holes.

Figure 8:
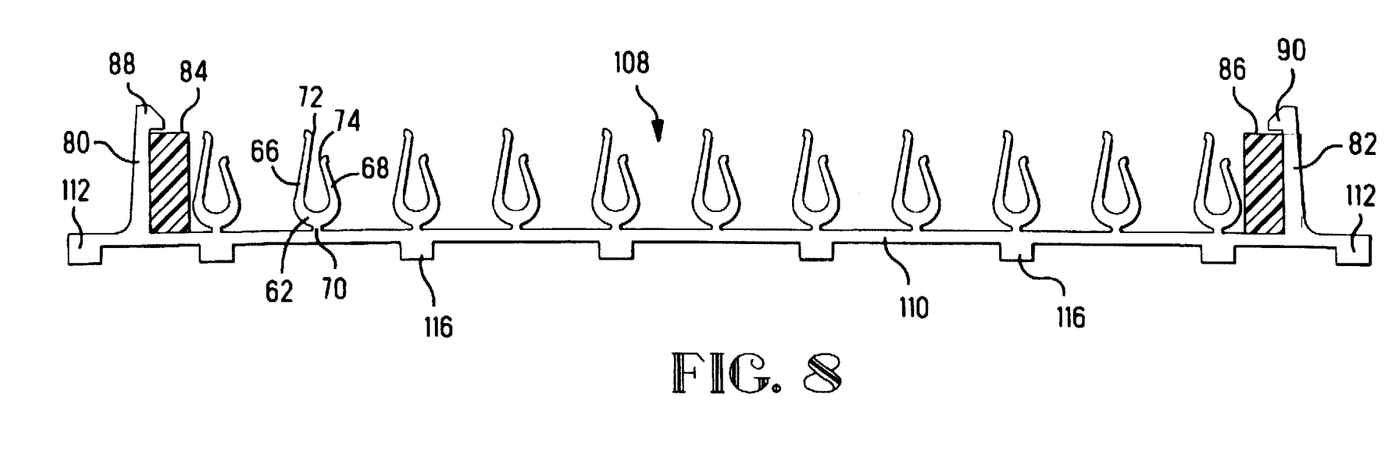
FIG. 8 illustrates a signal contact strip.

FIG. 8 illustrates a signal contact strip 108 which has a carrier strip 110 designed without solder tails so that it is surface mounted at its ends 112 to corresponding pads 114 on the mother board 24. Intermediate regions 116 of the carrier strip 110 provide support for the carrier strip 110 on the mother board 24. It will be noted that there is a gap between each hook member 88,90 and the respective ledge 84,86. The purpose of this gap is to allow the signal contact strip 108 to float with respect to the housing of the connector 20. This maintains the planarity of the contact strip 108 to insure that the ends 112 of the contact strip 108 engage the mother board 24.

Figure 9:
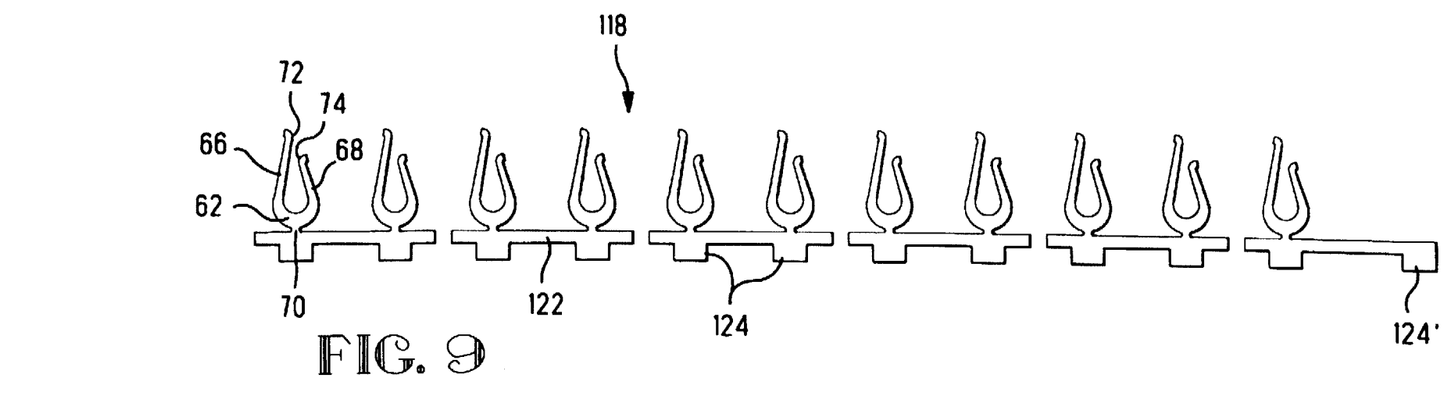
FIG. 9 illustrates a first version of a daisy chain contact strip.
Figure 10:
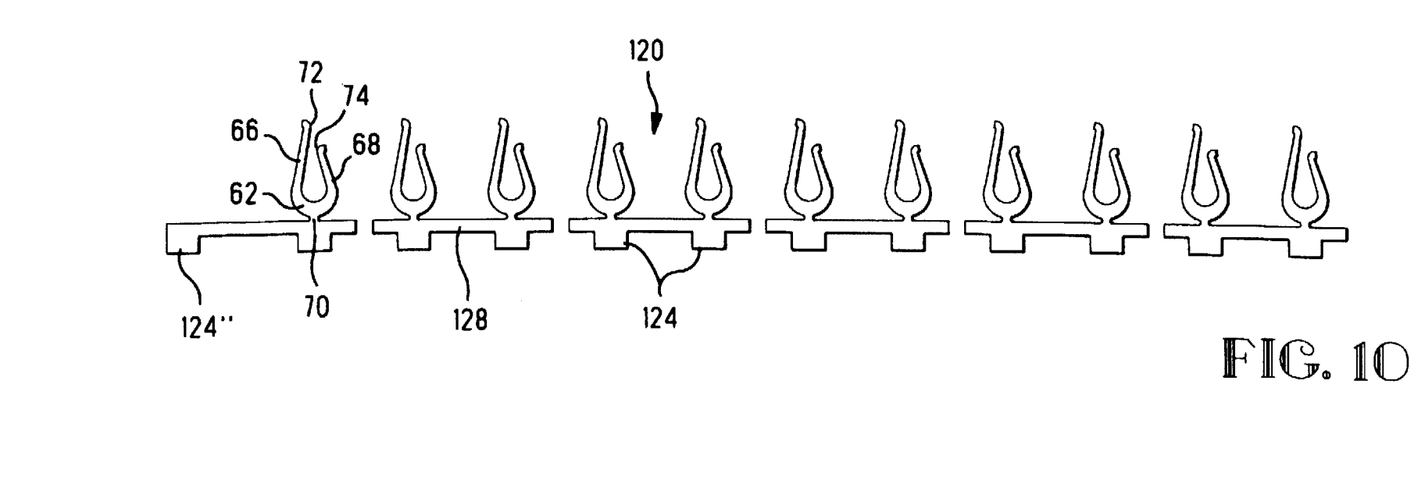
FIG. 10 illustrates a second version of a daisy chain contact strip.

As previously described, a daisy chain conductive path is set up through all of the modules 22 in the socket connector 20 to insure that all of the modules are installed. Thus, within each of the modules 22, a circuit path is established between a correspondingly positioned pair of contact pads. Thus, if this pair of pads is labeled A and B, the daisy chain proceeds from pad A to pad B on the first board, down to pad B on the second board, from pad B to pad A on the second board, down to pad A on the third board, from pad A to pad B on the third board, down to pad B on the fourth board, and so forth. Thus, the daisy chain is staggered along all of the boards. To form the daisy chain between the boards, the daisy chain contact strips 118 (FIG. 9) and 120 (FIG. 10) are provided. If the daisy chain required that the conductive path go from contact pad A to contact pad B on every board, then the contact strips would have to jog from contact pad B on a first board to contact pad A on the next board. However, with the aforedescribed arrangement, simple planar contact blanks can be utilized. As shown in FIG. 9, the contact elements 62 are attached to a carrier strip 122 which is separated between alternate adjacent contact elements. Each segment has a pair of support portions 124 for support on the mother board 24, with the end support portion 124' being soldered to the signal pad 126 on the mother board 24. Similarly, the contact strip 120 includes a carrier strip 128 which is also separated between alternate adjacent contact elements 62. The segments of the carrier strip 128 also have support portions 124, with an end support portion 124" (at the opposite end from the end support portion 124' of the carrier strip 122) being soldered to the signal pad 130 on the mother board 24. To provide for the staggering of the daisy chain, the separations of the carrier strips 122 and 128 are between different adjacent pairs of contact elements 62.

On the board 44, the signal pads are only in the first linear array 48, whereas the ground pads are in both the second linear array 50 and the third linear array 52. Therefore, the ground contact elements 62 engage the ground pads on both sides of the board 44, whereas the signal contact elements 62 only engage on one side of the board. The contact strips must therefore be properly oriented when installed in the housing of the socket connector 20.

The separator ribs 56 on the exterior side of the base wall 26 can have their lengths selected to control the capacitance between adjacent carrier strips.

The disclosed design of contact elements allows the same contact element to be used throughout the socket connector. By providing the connecting stub 70 between the contact element 62 and its associated carrier strip, the connecting stub acts as a pivot to allow self-centering of the contact element to the inserted board 44. This eliminates assembly tolerances in the deflection of the spring arms 66, 68.

Accordingly, there has been disclosed an improved memory module socket connector. While an illustrative embodiment of the present invention has been disclosed herein, it is understood that various modifications and adaptations to the disclosed embodiment will be apparent to those of ordinary skill in the art and it is intended that this invention be limited only by the scope of the appended claims.

What is claimed is:

1. A socket connector for supporting and electrically interconnecting a plurality of electronic modules to a substrate, each of the modules including a substantially planar and rectangular mounting board having an array of contact pads on a first major surface of the board along a leading edge of the board, wherein on each of said boards a correspondingly positioned pair of contact pads are utilized to daisy chain a conductive path through all of the modules supported and electrically interconnected by the socket connector, the connector comprising:

a housing having a base wall and four side walls together forming a substantially rectilinear cavity with an open side, said base wall being formed with a plurality of parallel channels open to said cavity, each of said base wall channels receiving the leading edge of a respective one of said boards, an opposed pair of said side walls each being formed with a plurality of parallel slots open to said cavity and extending from the open side of the cavity toward the base wall, and each of the side wall slots being aligned with a respective one of the base wall channels for supporting and guiding a respective one of said boards toward the respective base wall channel; and a plurality of planar contact strips each including an elongated carrier strip and a plurality of contact elements extending laterally from one edge of said carrier strip, the number of contact elements associated with each carrier strip being equal to the number of base wall channels, each of said contact elements being adapted to be received in a respective one of the base wall channels for engaging a respective contact pad of a board received in the respective base wall channel, each of said contact elements including a pair of spring arms extending from a connecting stub attached to the associated carrier strip one edge so as to be substantially U-shaped, and said pair of spring arms extending toward each other at their distal ends so as to each engage a respective major surface of a board received in the respective base wall channel with one of said pair of spring arms engaging a respective contact pad on that board;

wherein the pair of contact strips associated with said correspondingly positioned pair of contact pads on all of said boards are arranged with each carrier strip separated between alternate adjacent contact elements and with the pair of contact strips so arranged that the separations of the respective carrier strips are between different adjacent pairs of contact elements, whereby the daisy chained conductive path is staggered and alternates along said associated pair of contact strips.

2. The connector according to claim 1 wherein said base wall is formed with a plurality of through-slots each associated with one of the contact elements so that the contact elements can be installed in said housing from the exterior side of the base wall with the carrier strips remaining outside said housing.

3. The connector according to claim 2 wherein:

said base wall is formed with a pair of ledges extending between said opposed pair of side walls, said pair of ledges being parallel to and flanking said base wall channels; and said contact strips other than said pair of daisy chain contact strips are each formed with a pair of latch fingers extending laterally from said one edge of said carrier strip and flanking the plurality of contact elements associated with that contact strip, each of said latch fingers being formed with a hook member at its distal end for overlying a respective ledge when the contact strip is installed in the housing so as to interfere with subsequent removal of the contact strip.

4. The connector according to claim 3 wherein there is a gap between each hook member and its respective ledge when the contact strip is installed in the housing, whereby planarity of the contact strip is maintained.

5. The connector according to claim 2 wherein said base wall is formed with a plurality of separator ribs on said base wall exterior side interposed between adjacent ones of said carrier strips.

6. The connector according to claim 1 wherein said contact pads include signal pads and ground pads, said signal pads are in a first linear array on said first major surface spaced a first distance from said leading edge, said ground pads are in a second linear array on said first major surface spaced a second distance from said leading edge and alternating with said signal pads, a first of said contact element spring arms being of a first length and a second of said contact element spring arms being of a second length with said first spring arm adapted to engage a board major surface said first distance from said leading edge and said second spring arm adapted to engage a board major surface said second distance from said leading edge.

7. A socket connector for electrically interconnecting a plurality of electronic modules to a substrate, each of the modules including a mounting board having an array of contact pads along a leading edge of the board, wherein on each of said boards a correspondingly positioned pair of contact pads are utilized to daisy chain a conductive path through all of the modules electrically interconnected by the socket connector, the connector comprising:

a housing having a base wall formed with a plurality of parallel channels each configured to receive the leading edge of a respective said board; and a plurality of contact strips each including an elongated carrier strip and a plurality of contact elements extending laterally from one edge of the carrier strip, each of the contact elements being received in a respective one of the channels and being engageable with a respective said contact pad on a respective said board;

wherein the pair of contact strips associated with said correspondingly positioned pair of contact pads on all of said boards are arranged with each carrier strip separated between alternate adjacent contact elements and with the pair of contact strips so arranged that the separations of the respective carrier strips are between different adjacent pairs of contact elements, whereby the daisy chained conductive path is staggered and alternates along said associated pair of contact strips.

8. The connector according to claim 7 wherein said base wall is formed with a plurality of through-slots each associated with one of the contact elements so that the contact elements can be installed in said housing from an exterior side of the base wall with the carrier strips remaining outside said housing.

9. The connector according to claim 8 wherein:

said base wall is formed with a pair of ledges at respective opposite sides thereof; and said contact strips other than said pair of daisy chain contact strips are each formed with a pair of latch fingers extending laterally from said one edge of said carrier strip and flanking the plurality of contact elements associated with that contact strip, each of said latch fingers being formed with a hook member at its distal end for overlying a respective said ledge when the contact strip is installed in the housing so as to interfere with subsequent removal of the contact strip.

10. The connector according to claim 9 wherein there is a gap between each said hook member and its respective said ledge when the contact strip is installed in the housing, whereby planarity of the contact strip is maintained.

11. The connector according to claim 8 wherein said base wall is formed with a plurality of separator ribs on said base wall exterior side interposed between adjacent ones of said carrier strips.

12. The connector according to claim 7 wherein each of said contact elements includes a pair of spring arms which are substantially opposed to each other so as to be engageable with respective opposite major surfaces of a respective said board.

13. The connector according to claim 12 wherein a first of said contact element spring arms has a first length so as to be engageable with one of said board major surfaces at a first distance from said leading edge, and a second of said contact element spring arms has a second length so as to be engageable with the other of said board major surfaces at a second distance from said leading edge.

14. A socket connector for electrically interconnecting a plurality of electronic modules to a substrate, each of the modules including a mounting board having opposite major surfaces and a leading edge, each of the major surfaces having a respective array of contact pads aligned with respective contact pad positions along the leading edge, the connector comprising:

a housing having a base wall formed with a plurality of parallel channels each configured to receive the leading edge of a respective said board; and a plurality of contact elements secured in the housing and extending into respective said channels for electrically connecting with respective said contact pads on respective said boards;

wherein the contact elements are formed on contact strips each including an elongated carrier strip and a plurality of said contact elements, the contact elements remaining attached to their said carrier strips when the contact elements are secured in the housing, and at least one of the contact strips has separations in its said carrier strip between alternate adjacent contact elements.

15. The connector according to claim 14 wherein each of the contact strips includes all of the contact elements associated with a respective said contact pad position.

16. The connector according to claim 14 wherein:

said base wall is formed with a pair of ledges at respective opposite sides thereof; and said contact strips other than said at least one contact strip are each formed with a pair of latch fingers extending laterally from said one edge of said carrier strip and flanking the plurality of contact elements associated with that contact strip, each of said latch fingers being formed with a hook member at its distal end for overlying a respective said ledge when the contact strip is installed in the housing so as to interfere with subsequent removal of the contact strip.

17. The connector according to claim 16 wherein there is a gap between each said hook member and its said respective ledge when the contact strip is installed in the housing, whereby planarity of the contact strip is maintained.

18. The connector according to claim 14 wherein said base wall is formed with a plurality of through-slots each associated with one of the contact elements so that the contact elements can be installed in said housing from an exterior side of the base wall with the carrier strips remaining outside said housing, and said base wall is formed with a plurality of separator ribs on said base wall exterior side interposed between adjacent ones of said carrier strips.

19. The connector according to claim 14 wherein each of said contact elements includes a pair of spring arms which are substantially opposed to each other so as to be engageable with respective opposite major surfaces of a respective said board.

20. The connector according to claim 19 wherein a first of said contact element spring arms has a first length so as to be engageable with one of said board major surfaces at a first distance from said leading edge, and a second of said contact element spring arms has a second length so as to be engageable with the other of said board major surfaces at a second distance from said leading edge.

* * * * *